United States Patent
Hill et al.

[11] Patent Number: 6,102,275
[45] Date of Patent: Aug. 15, 2000

[54] BOND HEAD HAVING DUAL AXES OF MOTION

[75] Inventors: William H. Hill, Pala; John B. Gabaldon, San Diego; Daniel D. Evans, Jr., Oceanside, all of Calif.

[73] Assignee: Palomar Technologies, Inc., Vista, Calif.

[21] Appl. No.: 09/113,722

[22] Filed: Jul. 10, 1998

[51] Int. Cl.[7] .......................... B23K 31/00; B23K 31/02; B23K 37/00

[52] U.S. Cl. ........................ 228/180.5; 228/4.5; 228/8; 228/103

[58] Field of Search .................. 228/4.5, 180.5, 228/102, 103, 8, 9

[56] References Cited

U.S. PATENT DOCUMENTS

| | | | |
|---|---|---|---|
| 3,941,294 | 3/1976 | Johannsmeier | 228/4.5 |
| 4,239,144 | 12/1980 | Elles et al. | 228/1 R |
| 4,266,710 | 5/1981 | Bilane et al. | 228/4.5 |
| 4,597,522 | 7/1986 | Kobayashi | 228/179 |
| 5,031,821 | 7/1991 | Kaneda et al. | 228/110 |
| 5,156,318 | 10/1992 | Suzuki et al. | 228/4.5 |
| 5,192,018 | 3/1993 | Terakado et al. | 228/179 |
| 5,238,173 | 8/1993 | Ura et al. | 228/104 |
| 5,246,513 | 9/1993 | Yoshida et al. | 156/64 |
| 5,626,276 | 5/1997 | Lo et al. | 228/4.5 |
| 5,723,364 | 3/1998 | Nakamura et al. | 437/209 |

Primary Examiner—Patrick Ryan
Assistant Examiner—Kiley Stoner
Attorney, Agent, or Firm—Rodney F. Brown

[57] ABSTRACT

A bond head is provided for a wire bonding machine having a linear axis frame, a rotary axis frame, a bond tool and a wire clamp. The linear axis frame is vertically linearly displacable along a linear axis, while the rotary axis frame is rotationally displacable along a rotary axis. A pivotal connector is provided which pivotally connects the rotary axis frame to the linear axis frame, enabling the rotary axis frame to rotate independent of linear displacement of the linear axis frame. The bond tool is connected to the rotary axis frame and is vertically linearly displacable in response to vertical linear displacement of the linear axis frame and rotationally displacable in response to rotational displacement of the rotary axis frame. The wire clamp is connected to the linear axis frame and is vertically linearly displacable in response to vertical linear displacement of the linear axis frame, while the wire clamp is maintained rotationally stationary during rotational displacement of the rotary axis frame. The bond head also includes a linear motion assembly and a rotary motion assembly. The linear motion assembly has a linear driver, a linear position detector and a linear driver controller. The rotary motion assembly correspondingly has a rotary driver, a rotary position detector and a rotary driver controller.

29 Claims, 7 Drawing Sheets

PRIOR ART

BOND HEAD HAVING DUAL AXES OF MOTION

TECHNICAL FIELD

The present invention relates generally to automated wire bonding, and more particularly to a bond head for a wire bonding machine which is used to bond a fine wire conductor to a plurality of electrically conductive bonding sites.

BACKGROUND OF THE INVENTION

Miniature, electric power drawing elements, such as integrated circuits, semiconductors and the like, included within a larger host device typically have many electrically conductive pads. Each conductive pad requires electrical contact with one or more corresponding conductive pads on the same element or associated elements of the host device to form an electrically conductive connection between the pads. The electrically conductive connection is provided by a segment of fine, electrically conductive wire which extends between the pads and is bonded to a bonding site on each of the pads. Wire bonding is an automated operation performed during assembly of the host device using a machine having a high degree of speed and precision. The wire bonding operation is cyclic, comprising many bonding cycles integrated into a continuous unitary process. Each bonding cycle of the process comprises a number of discrete tasks performed sequentially by specific components of the wire bonding machine.

In a simple case where an electrical connection is required between only two pads, the bonding cycle comprises the tasks of retaining an element or elements including the pad pair, feeding a wire from a wire supply to the pad pair, positioning the wire at the first bonding site on the first pad of the pair, bonding the wire to the first bonding site, repositioning the wire at the second bonding site on the second pad of the pair, bonding the wire to the second bonding site, and breaking off the wire at the second bonding site to provide a wire segment which electrically connects the first and second pads. These tasks are repeated in the next bonding cycle at another pad pair. For more complex bonding cycles where electrical connection is required between a string of three or more pads, the wire is positioned and bonded to the bonding site on each pad of the string in series. The wire is not broken off until the bond is completed at the final bonding site to provide a wire segment which electrically connects every pad of the string.

U.S. Pat. No. 4,610,387, incorporated herein by reference, discloses a device, commonly termed the "bond head", which is an assembly of cooperative components integrated into a wire bonding machine to perform the particular bonding cycle tasks of positioning the wire at a bonding site, bonding the wire to the bonding site, repeating the positioning and bonding tasks at the next bonding site and breaking off the wire at the final bonding site. It is apparent that each task in the bonding cycle has an associated time requirement. The present invention recognizes a need for a bond head which performs the tasks necessary to bond a wire to a plurality of bonding sites within a reduced time to render the wire bonding operation more time efficient, while satisfying the exacting performance requirements of the resulting bonds.

Therefore, it is an object of the present invention to provide an effective high-speed bond head. This object and others are accomplished in accordance with the invention described hereafter.

SUMMARY OF THE INVENTION

The present invention is a bond head for a wire bonding machine. The bond head comprises a linear axis frame, a rotary axis frame, a bond tool and a wire clamp. The linear axis frame is vertically linearly displacable along a linear axis, while the rotary axis frame is rotationally displacable along a rotary axis. A pivotal connector is provided which pivotally connects the rotary axis frame to the linear axis frame, enabling the rotary axis frame to rotate independent of linear displacement of the linear axis frame. The bond tool is connected to the rotary axis frame and is vertically linearly displacable in response to vertical linear displacement of the linear axis frame and rotationally displacable in response to rotational displacement of the rotary axis frame. The wire clamp is connected to the linear axis frame and is vertically linearly displacable in response to vertical linear displacement of the linear axis frame, while the wire clamp is maintained rotationally stationary during rotational displacement of the rotary axis frame. The clamp has an open position permitting travel of a wire past the clamp and a closed position preventing travel of a wire past said clamp.

The bond head further comprises a linear motion assembly and a rotary motion assembly. The linear motion assembly includes a linear driver driving vertical linear displacement of the linear axis frame. The linear driver preferably includes a linear driver voice coil and a linear driver magnet. The linear motion assembly also includes a linear position detector and a linear driver controller. The linear position detector is preferably a photoelectric device and the linear driver controller is preferably a linear servo system in communication with the linear driver and linear position detector. The rotary motion assembly correspondingly includes a rotary driver driving rotary displacement of the rotary axis frame. The rotary driver preferably includes a rotary driver voice coil and a rotary driver magnet. The rotary motion assembly also includes a rotary position detector and a rotary driver controller. The rotary position detector is preferably a photoelectric device and the rotary driver controller is preferably a rotary servo system in communication with the rotary driver and rotary position detector.

The present invention is further a wire bonding method utilizing the above-recited bond tool and clamp in cooperation with a bonding wire. The bond tool has a linear axis of motion and a rotary axis of motion. The bonding wire slidably engages the bond tool and has a first point on a first side of the bond tool and a second point on a second opposing side of the bond tool. The clamp is positioned on the second side of the bond tool in fixed relation to the bond tool with respect to the linear axis of motion and is selectively transitionable between the closed and open position.

The method comprises the step of positioning the bond tool at a first bonding site while the clamp is in the open position. The bond tool is positioned such that the first point on the bonding wire is proximal to the first bonding site and the second point on the wire is distal to the first bonding site. Positioning the bond tool is achieved by vertically linearly displacing the bond tool to the vertical level of the first bonding site while rotationally displacing the bond tool to perpendicularly align the bond tool with the first bonding site. The bond tool applies a first bonding force along the rotary axis of motion to the first point while transferring energy from an ultrasonic transducer to the first point, thereby bonding the first point to the first bonding site in the form of a ball bond. Completion of the first bond is determined by measuring the rotational displacement of the bond tool as the first bonding force is applied to the first point. Rotational displacement is correlated to deformation of the wire, which is an indicator of bond completion. A loop is then formed in the wire between the first and second points of the wire by vertically linearly and rotationally displacing the bond tool while maintaining the first bond.

The bond tool is repositioned at a second bonding site with the second point proximal to the second bonding site and the first point distal to the second bonding site. Repositioning the bond tool is achieved by vertically linearly displacing the bond tool to the vertical level of the second bonding site while rotationally displacing the bond tool to perpendicularly align the bond tool with the second bonding site. The bond tool applies a second bonding force along the rotary axis of motion to the second point while transferring energy from the ultrasonic transducer to the second point, thereby bonding the second point to the second bonding site in the form of a stitch bond, while simultaneously transitioning the clamp from the open position to the closed position. Completion of the second bond is likewise determined by measuring the rotational displacement of the bond tool as the second bonding force is applied to the second point. The bond tool is then raised away from the second bonding site with respect to the linear axis of motion while simultaneously rotating the bond tool away from the second bonding site with respect to the rotary axis of motion. These motions break off the wire proximal to the second bonding site, providing a tail at the broken end of the wire proximal to the bond head. The result is an electrically conductive wire segment extending from the first bonding site to the second bonding site and bonded to the first and second bonding sites.

Alternatively, if a series of three or more bonding sites are present, the wire is not broken off proximal to the second bonding site. Instead the bond tool is repositioned at a third bonding site in the above-described manner with a third point on the wire on the second side of the bond tool being positioned proximal to the third bonding site and the first and second points on the wire being positioned distal to the third bonding site. The bond tool applies a third bonding force along the rotary axis of motion to the third point, bonding the third point to the third bonding site in the form of a stitch bond. These steps are repeated for each additional bonding site, if any. The wire is broken off only after the bond is completed at the final bonding site of the series.

The bond head of the present invention achieves substantial time efficiencies by its specific structural configuration and method of operation. In particular, the operating speed of the bond head is increased by associating the heavier components of the bond head with the linear axis frame and providing separate assemblies for controlling motion of the linear and rotary axis frames. The linear axis frame carries the weight of the rotary axis frame and connected components, a portion of the linear motion assembly, the wire clamp and a targeting lens. In comparison, the weight load on the rotary axis frame is restricted to the ultrasonic transducer and a portion of the rotary motion assembly. Accordingly, the rotary axis frame, which has a higher duty cycle than the linear axis frame, is less encumbered by weight than the linear axis frame and is capable of operating at greater speed and with greater sensitivity, which is of particular significance during application of bonding forces.

Independent operation of the rotary axis frame relative to the linear axis frame enables the bond head to perform certain operating tasks in parallel, realizing additional time efficiencies. In particular, the rotary axis frame positions the bond tool for tail formation while the linear axis frame simultaneously positions the bond tool for wire break off and ball formation. Closure of the wire clamp is also performed simultaneous with formation of the second stitch bond.

The present invention will be further understood from the drawings and the following detailed description.

BRIEF DESCRIPTION OF THE DRAWINGS

FIG. 3A–3K are a diagrammatic view of a bond tool and cooperative wire clamp employed in the bond head of FIG. 1, which shows the motive steps of the bond tool and wire clamp during operation of the bond head.

DESCRIPTION OF PREFERRED EMBODIMENTS

Figure 1:
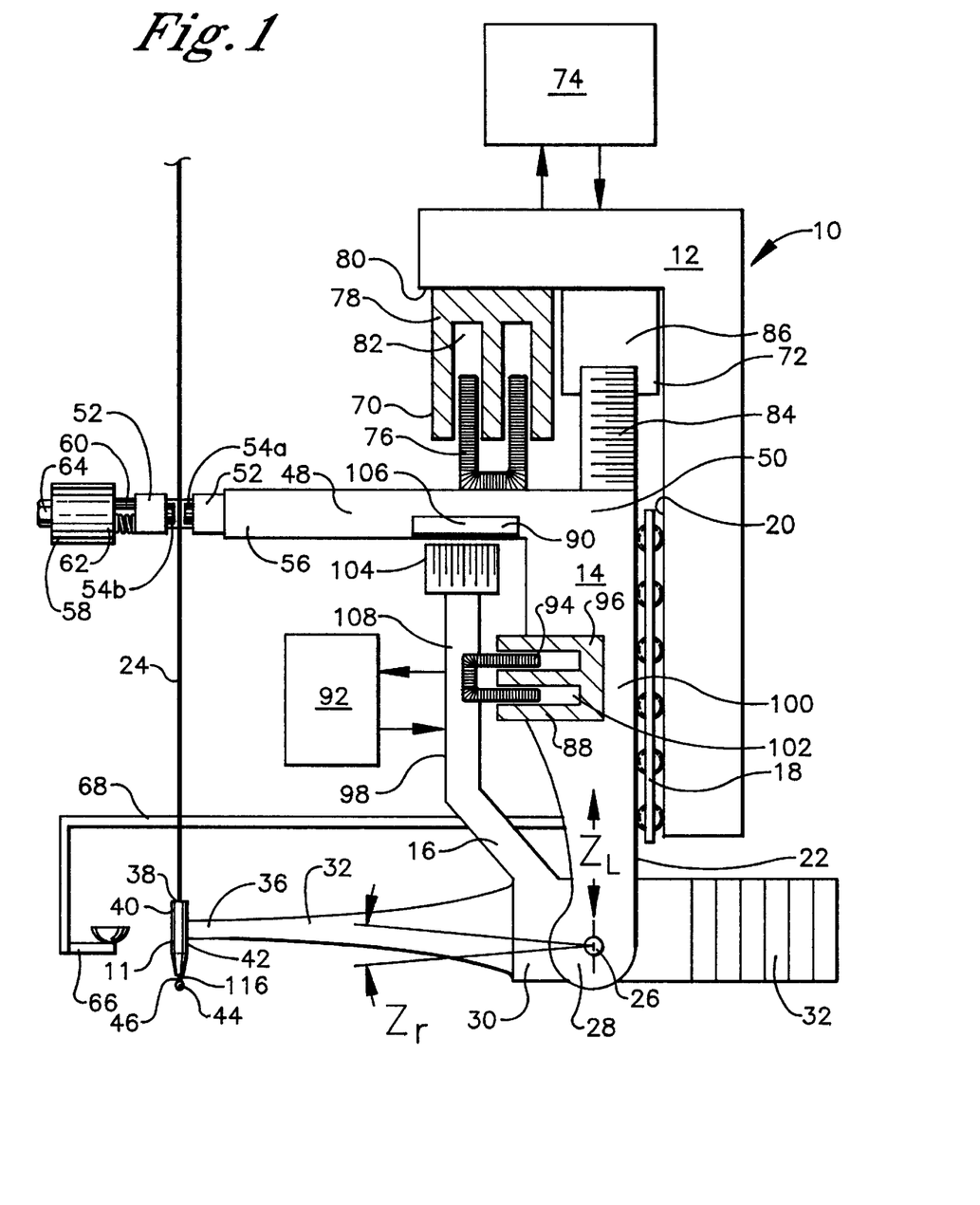
FIG. 1 is a conceptualized side view of a bond head of the present invention.
Figure 2:
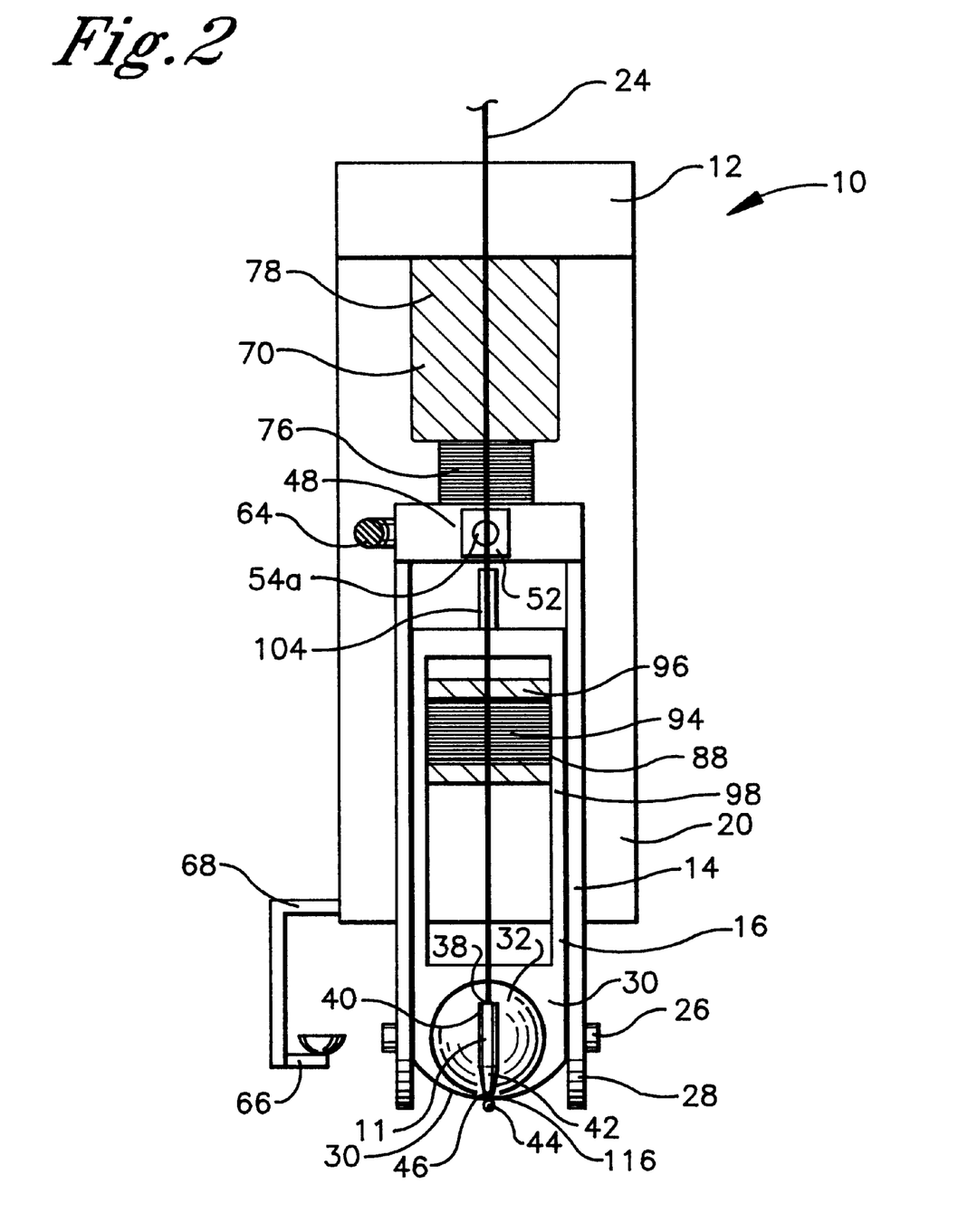
FIG. 2 is a conceptualized front view of the bond head of FIG. 1.

Referring initially to FIGS. 1 and 2, the bond head of the present invention is shown and generally designated 10. As is appreciated by the skilled artisan, the bond head 10 is an apparatus forming an integral part of a wire bonding machine, the remainder of which is not shown. The bond head 10 comprises a bond tool 11 supported by three substantially rigid frames, a bond head frame 12, a linear axis frame 14, and a rotary axis frame 16. The bond head frame 12 is connected to a conventional XY positioner (not shown) of the wire bonding machine. The XY positioner, in cooperation with the bond head frame 12, enables selective positioning of the bond head 10 within a horizontal XY plane containing the X and Y axes. The present invention is directed to selective linear positioning of the bond tool 11 along a linear Z axis ($Z_L$) and to selective rotary positioning of the bond tool 11 along a rotary axis ($Z_R$), wherein both $Z_L$ and $Z_R$ are contained within a vertical Z plane which is normal to the horizontal XY plane. The linear axis frame 14 and rotary axis frame 16, in cooperation with the bond head frame 12, enable selective linear and rotary positioning of the bond tool 11 along $Z_L$ and $Z_R$, respectively, within the Z plane.

The bond head frame 12 has an inverted "L" configuration with a linear bearing 18 attached to the interior vertical face 20 of the bond head frame 12. The linear axis frame 14 has a vertical displacement face 22 which slidably engages the linear bearing 18. The linear bearing 18 permits bi-directional vertical linear movement of the linear axis frame 14 relative to the bond head frame 12 when a vertical linear force is applied to the linear axis frame 14. Thus, the bond tool 11, which is interconnected to the linear axis frame 14, moves linearly along $Z_L$ within the Z plane in response to vertical linear movement of the linear axis frame 14 along $Z_L$. It is further noted that the linear axis frame 14, the rotary axis frame 16 and an electrically conductive bonding wire 24 guided by the bond tool 11 also all preferably lie within the Z plane. Upper and lower linear stops (not shown) may be provided to maintain the linear axis frame 14 within maximum upper and lower travel limits.

The bond head 10 further comprises a pivotal connector 26 which pivotally connects the linear axis frame 14 at its lower end 28 to the rotary axis frame 16 at its lower end 30. The pivotal connector 26 may be any conventional pivoting means, such as an axle secured within a jewel cup or bearing pair positioned at the lower ends 28, 30. The pivotal connector 26 defines an axis of rotation which allows bi-directional rotary movement of the rotary axis frame 16 about the pivotal connector 26 when a radial force is applied to the rotary axis frame 16. Thus, the bond tool 11, which is interconnected to the rotary axis frame 16, moves rotationally along $Z_R$ within the Z plane in response to rotary movement of the rotary axis frame 16 about the pivotal connector 26 along $Z_R$. Clockwise and counterclockwise rotary stops (not shown) may be provided to maintain the rotary axis frame 16 within maximum clockwise and counterclockwise travel limits.

It is apparent that the bond tool 11 and rotary axis frame 16 are rotationally displacable along $Z_R$ independent of vertical linear displacement of the bond tool 11 and linear axis frame 14 along $Z_L$. Conversely, the bond tool 11 and linear axis frame 14 are vertically linearly displaceable along $Z_L$ independent of rotary displacement of the bond tool 11 and rotary axis frame 16 along $Z_R$. Accordingly, the bond tool 11 can be simultaneously linearly displaced along $Z_L$ and rotationally displaced along $Z_R$ by simultaneous vertical linear movement of the linear axis frame 14 and rotary movement of the rotary axis frame 16 along $Z_L$ and $Z_R$, respectively, within the Z plane. Alternatively, the bond tool 11 can be linearly displaced along $Z_L$ while being maintained rotationally stationary with respect to $Z_R$, by vertical linear movement of the linear axis frame 14 along $Z_L$ while maintaining the rotary axis frame 16 rotationally stationary with respect to $Z_R$. The bond tool 11 can also be maintained linearly stationary with respect to $Z_L$ while being rotationally displaced along $Z_R$, by rotary movement of the rotary axis frame 16 along $Z_R$ while maintaining the linear axis frame 14 linearly stationary with respect to $Z_L$. It is noted that the bond head frame 12 is stationary at all times with respect to $Z_L$ and $Z_R$ during displacement of the bond tool 11, and correspondingly during vertical linear displacement of the linear axis frame 14 or rotary displacement of the rotary axis frame 16 along $Z_L$ or $Z_R$.

The linear axis frame 14 and rotary axis frame 16 are both substantially vertical elongate members extending upward from the pivotal connector 26 without further interconnection to one another. The lower end 30 of the rotary axis frame 16 is configured as a mounting bracket to retain an ultrasonic transducer 32 in fixed relation to the rotary axis frame 16. The ultrasonic transducer 32 is substantially rigid and has a horizontal elongate configuration extending from opposite lateral sides of the lower end 30. The bond tool 11, alternatively termed a capillary, is positioned at the end 36 of the ultrasonic transducer 32 proximal to the wire 24. The bond tool 11 is maintained in fixed relation to the rotary axis frame 16 by fixed attachment to the ultrasonic transducer 32 and serves as a wire guide and bonding force applicator in a manner described below. The bond tool 11 has an open longitudinal passageway 38 extending the full length of the bond tool 11 from the upper end 40 to the lower end 42, with the upper end 40 being relatively wide and the lower end 42 tapering to a relatively narrow tip. The diameter of the passageway 38 is sufficiently broad throughout its length to permit the wire 24 to travel unimpeded through the passageway 38. However, the diameter of the lower end 42 is sufficiently narrow to prevent the ball 44 positioned on the end 46 of the wire 24 beneath the bond tool 11, which is formed in a manner described below, from traveling upward through the lower end 42 into the bond tool 11. The bond tool 11 is preferably fabricated from a durable material, such as a ceramic, which is capable of transferring energy output from the ultrasonic transducer 32 to the end 46 of the wire 24.

A rigid clamp arm 48 is integral with the linear axis frame 14 at its upper end 50. The clamp arm 48 extends horizontally from the upper end 50 of the linear axis frame in the direction of the wire 24. A wire clamp 52 having opposing jaws 54a, 54b is fixedly attached to the end 56 of the clamp arm 48 proximal to the wire 24. Accordingly, the clamp 52 moves in correspondence with movement of the linear axis frame 14. The clamp 52 is selectively transitionable between a closed position and an open position. The jaws 54a, 54b are drawn together in the closed position, pinching the wire 24 between the jaws 54a, 54b which locks the wire 24 into the clamp 52. In the open position, the jaws 54a, 54b are separated by a distance exceeding the diameter of the wire 24 which enables the wire 24 to travel unimpeded through the clamp 52. A clamp actuator 58 is provided adjacent to the clamp 52 which enables selective transitioning of the clamp 52 between the open and closed positions. The clamp actuator 58 may be substantially any conventional actuating means, such as a solenoid switch having a plunger 60 to maintain the clamp 52 in the closed position when the plunger 60 is extended and an opposing spring 62 to maintain the clamp 52 in the open position when the plunger 60 is retracted. An actuator bracket 64 is provided to secure the clamp actuator 58 to the end 56 of the clamp arm 48. The actuator bracket 64 extends behind the clamp actuator 58 and wire 24 so that the bracket 64 does not contact the wire 24 and impede the ability of the wire 24 to travel past the bracket 64 in either vertical direction. An actuator controller (not shown) may also be provided to enable automatic transitioning of the clamp actuator 58 between the open and closed positions in correspondence with predetermined operating steps of the bond head 10 as described below. A targeting lens (not shown) used in aligning the bond tool 11 with a bonding site may also be attached to the clamp arm 48 or otherwise connected to the linear axis frame 14. It is noted that FIG. 2 shows the clamp 52 and the actuator bracket 64 in cross-section with the clamp actuator 58 omitted for clarity of illustration.

An electronic flame off wand 66 is connected to the bond head frame 12 by means of a wand mount 68 fixably attached to the bond head frame 12. The wand mount 68 extends behind the linear and rotary axis frames 14, 16 and wire 24 to avoid obstructing movement of the wire 24 and frames 14, 16. The wand 66 is rotatably attached to the wand mount 68 so that it is transitionable between a clearance position and an active position. The clearance position is shown in FIG. 1, wherein the wand 66 is inoperatively located at a position set back away from the wire 24 and bond tool 11. In the active position, the wand 66 is rotated forward away from the wand mount 68 toward the wire 24 and bond tool 11 so that the wand 66 is operatively aligned with the vertical linear axis of the wire 24 in a manner described below.

The bond head 10 additionally comprises a linear motion assembly for controlling vertical linear movement of the linear axis frame 14 and correspondingly movement of the bond tool 11 along $Z_L$. The linear motion assembly includes a linear driver 70, a linear position detector 72 and a linear driver controller 74. The linear driver 70 powers vertical linear movement of the linear axis frame 14 and the components interconnected to the frame 14, including the rotary axis frame 16 and bond tool 11, along $Z_L$. Although the present invention is not limited to a specific linear driver, a preferred linear driver is a voice coil 76 and an associated magnet 78 (shown in cross section) of the type conventionally employed in acoustic speakers. The voice coil 76 is attached to the upper end 50 of the linear axis frame 14 and the magnet 78 is attached to the interior horizontal face 80 of the bond head frame 12 opposite the voice coil 76. The voice coil 76 and magnet 78 are configured such that the voice coil 76 is selectively extendable into the magnet cavity 82 as a function of the electrical energy supplied to the voice coil 76. The degree of vertical linear movement by the linear axis frame 14 and correspondingly the bond tool 11 correlates directly to the degree of penetration into the magnet 78 by the voice coil 76. FIGS. 1 and 2 depict a conceptual configuration of the voice coil 76 and magnet 78 for clarity of illustration. In a preferred embodiment, the linear motion magnet encloses a continuous circular cavity which receives a correspondingly curved linear motion voice coil.

The linear position detector 72 determines the instantaneous position of the linear axis frame 14 as it moves vertically linearly along $Z_L$, which correlates to the instantaneous position of the bond tool 11 along $Z_L$. Although the present invention is not limited to a specific linear position detector, a preferred linear position detector is a photoelectric device such as a photo detector including an encoder scale 84 and a reader head 86. The encoder scale 84 is attached to the upper end 50 of the linear axis frame 14 and the reader head 86 is attached to the bond head frame 12 in a position adjacent to the encoder scale 84.

The linear driver controller 74 directs operation of the linear driver 70, positioning the linear axis frame 14 at a location correlated with a predetermined location of the bond tool 11 along $Z_L$ at a predetermined time. Although the present invention is not limited to a specific linear driver controller, a preferred linear driver controller is a servo system, which may be remotely positioned relative to the remaining components of the bond head 10. A servo system of the type having utility in the bond head of the present invention is disclosed in U.S. Pat. No. 4,817,848, incorporated herein by reference. The servo system 74 is in electrical communication with the linear driver 70 and the linear position detector 72, receiving position feedback signals correlated to $Z_L$ from the linear position detector 72 and transmitting movement instruction signals correlated to $Z_L$ to the linear driver 70 in response to the position feedback signals.

The bond head 10 also comprises a rotary motion assembly having two modes of operation. The first mode of operation is a positioning mode which controls rotary movement of the rotary axis frame 16 about the pivotal connector 26 and correspondingly movement of the bond tool 11 along $Z_R$. The second mode of operation is a force applying mode which controls the magnitude of the bonding force applied to the wire 24 through the bond tool 11. The rotary motion assembly is functionally independent of the linear motion assembly, but structurally similar to the linear motion assembly, including a rotary driver 88, a rotary position detector 90 and a rotary driver controller 92. The rotary driver 88 powers rotary movement of the rotary axis frame 16 and the components fixedly attached to the frame 16, including the bond tool 11, along $Z_R$. A preferred rotary driver is a voice coil 94 and an associated magnet 96 (shown in cross section) similar to the voice coil 76 and magnet 78. The voice coil 94 is attached to the midsection 98 of the rotary axis frame 16 and the magnet 96 is attached to the midsection 100 of the linear axis frame 14 opposite the voice coil 94. The voice coil 94 and magnet 96 are configured such that the voice coil 94 is selectively extendable into the magnet cavity 102 as a function of the electrical energy supplied to the voice coil 94. The degree of rotary movement by the rotary axis frame 16 and correspondingly the bond tool 11 correlates directly to the degree of penetration into the magnet 96 by the voice coil 94. FIGS. 1 and 2 depict a conceptual configuration of the voice coil 94 and magnet 96 similar to that of the voice coil 76 and magnet 78 for clarity of illustration. In a preferred embodiment, the rotary motion magnet encloses a continuous circular cavity which receives a correspondingly curved rotary motion voice coil.

The rotary position detector 90 determines the instantaneous position of the rotary axis frame 16 as it rotates about the pivotal connector 26 along $Z_R$, which correlates to the instantaneous position of the bond tool 11 along $Z_R$. A preferred rotary position detector is a photoelectric device such as a photo detector including an encoder scale 104 and a reader head 106 similar to the encoder scale 84 and reader head 86. The encoder scale 104 is attached to the upper end 108 of the rotary axis frame 16 and the reader head 106 is attached to the upper end 50 of the linear axis frame 14 in a position adjacent to the encoder scale 104.

The rotary driver controller 92 directs operation of the rotary driver 88, positioning the rotary axis frame 16 at a location correlated with a predetermined location of the bond tool 11 along $Z_R$ at a predetermined time. A preferred rotary driver controller is a servo system similar to the servo system 74. The servo system 92, which may likewise be remotely positioned relative to the remaining components of the bond head 10, is in electrical communication with the rotary driver 88 and the rotary position detector 90, receiving position feedback signals correlated to $Z_R$ from the rotary position detector 90 and transmitting movement instruction signals correlated to $Z_R$ to the rotary driver 88 in response to the position feedback signals.

METHOD OF OPERATION

Figures 3, 3A:
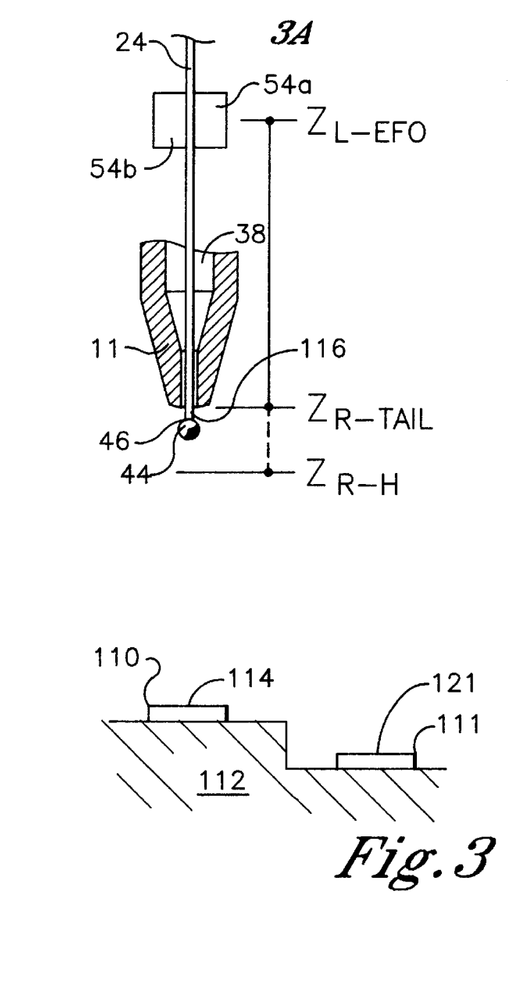

The method of operating the bond head 10 is described below with reference to FIG. 3 in conjunction with FIG. 1. FIG. 3 depicts the tasks performed by the bond head 10 during an exemplary single bonding cycle of the present continuous wire bonding process. The bonding cycle is shown in a time sequence of steps 3A–3K, with generally time elapsing in FIG. 3 from left to right. FIG. 3 also correlates steps 3A–3K to the vertical linear movements of the linear axis frame 14 and the rotary movements of the rotary axis frame 16, which are expressed in terms of positions on $Z_L$ and $Z_R$, respectively. For purposes of illustration, only the bond tool 11 and jaws 54a, 54b of the bond head 10 are shown in FIG. 3. It is understood, however, that the clamp 52 is fixedly connected to the linear axis frame 14 as described above with reference to FIGS. 1 and 2 so that the jaws 54a, 54b move along $Z_L$ in response to vertical linear movement of the linear axis frame 14 along $Z_L$. It is further understood that the bond tool 11 is interconnected to the linear axis frame 14 and rotary axis frame 16 as described above so that the bond tool 11 moves along $Z_L$ or $Z_R$ in response to vertical linear movement of the linear axis frame 14 or rotary movement of the rotary axis frame 16 along $Z_L$ or $Z_R$, respectively.

Steps 3A–3K illustrate a simple bonding cycle which produces an electrically conductive connection between only two bonding sites contained within a pad pair consisting of a first pad 110 and a second pad 111. The pads 110, 111 are shown positioned on a common element depicted by a substrate 112, but on different vertical levels of the substrate 112 corresponding to different points on $Z_L$. Alternatively, the pads 110, 111 can be positioned on the same vertical level corresponding to the same point $Z_L$. Although not shown, it also is within the scope of the present invention to alternatively position the second pad 111 on an associated element separate from the element 112 containing the first pad 110. In any case, the pads 110, 111 and substrate(s) 112 remain stationary with respect to $Z_L$ and $Z_R$ throughout the bonding cycle, although movement of the pads 110, 111 and substrate(s) 112 is permitted within the XY plane.

Step 3A shows the initial condition of the bond head 10 at the outset of the bonding cycle. In step 3A, the bond tool 11 is positioned above the pads 110, 111 and substrate 112 and vertically aligned with the first bonding site 114 on the first pad 110. The linear axis frame 14 is in a raised position along $Z_L$ to a point $Z_{L-EFO}$ which corresponds to a linear electric flame off position. The rotary axis frame 16 is in a clockwise rotated position along $Z_R$ to a point $Z_{R-TAIL}$ which corresponds to a rotary tail formation position. It is noted that step 3A is also the condition of the bond head 10 at the completion of the previous bonding cycle since the bonding cycles are typically continuously performed in repetition. In step 3A the clamp 52 is in the closed position and the ball 44 is positioned on the end 46 of the wire 24 with a short wire segment 116 exposed between the ball 44 and the bond tool 11 as a result of the previous bonding cycle.

Figure 3B:
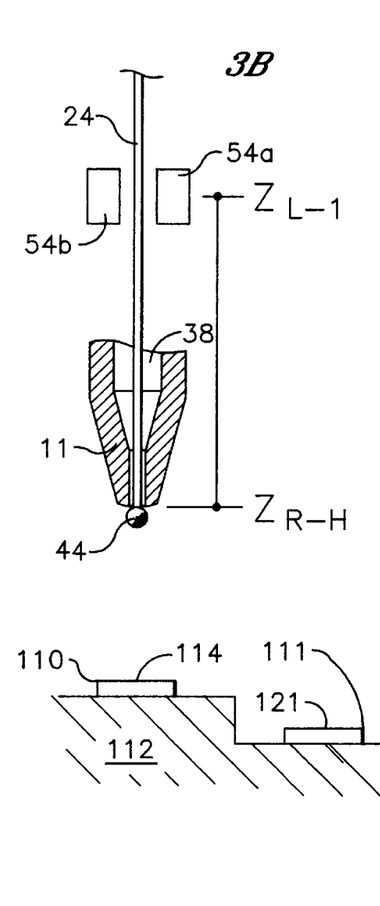

The initial tasks of the bonding cycle include a clamp transitioning task shown in step 3B, wherein the clamp 52 is transitioned from the closed position of step 3A to the open position. Step 3B also includes a positioning task, wherein the linear axis frame 14 is lowered down along $Z_L$ to a point $Z_{L-1}$ closer to the first bonding site 114 and the rotary axis frame 16 is rotated counterclockwise along $Z_R$ to a point $Z_{R-H}$ corresponding to a rotary position where the longitudinal central axis of the bond tool 11 is perpendicularly aligned with the substantially horizontal planar surface of the first pad 110. It is noted that rotation of the rotary axis frame 16 to point $Z_{R-H}$ is performed sequentially in time after transitioning of the clamp 52 to the open position, although rotation of the rotary axis frame 16 may be performed simultaneous with vertical linear movement of the linear axis frame 14. Rotation of the rotary axis frame 16 to point $Z_{R-H}$ causes the bond tool 11 to position flush against the ball 44, eliminating exposure of the wire segment 116 below the bond tool 11.

Figure 3C:
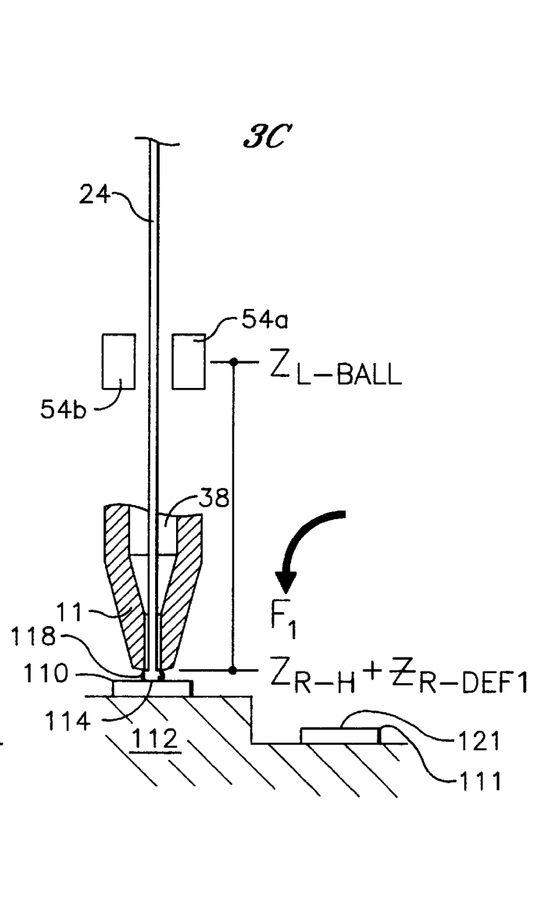

The next tasks of the bonding cycle include another positioning task and a bond formation task as shown in step 3C. In the positioning task, the linear axis frame 14 is lowered down along $Z_L$ to a point $Z_{L-BALL}$, while maintaining the rotary axis frame 16 at point $Z_{R-H}$ and the bond tool 11 perpendicularly aligned with the first pad 110 to enhance performance of the subsequent bond formation task. The positioning task brings the ball 44 into contact with the first bonding site 114 as detected by the rotary servo system 92. Upon contact the rotary motion assembly transitions from the first positioning mode of operation to the second force applying mode of operation, wherein the bond tool 11 applies a counterclockwise bonding force $F_1$ to the ball 44 along $Z_R$. The ultrasonic transducer 32 is activated in correspondence with application of the bonding force $F_1$. The resulting energy output from the ultrasonic transducer 32, in cooperation with the bonding force $F_1$ applied by the bond tool 11, deforms the ball 44 downward against the first pad 112. Deformation of the ball 44 causes the rotary axis frame 16 to rotate an additive distance $Z_{R-DEF1}$ counterclockwise past point $Z_{R-H}$ along the $Z_R$ axis and creates the first wire bond 118, termed a ball bond, at the first bonding site 114. The distance that the rotary axis frame 16 travels along the $Z_R$ axis during the ball bond formation task in response to the bonding force $F_1$ is correlated to the degree of ball deformation and correspondingly the progress of the ball bond formation task. Accordingly, the rotary position detector 90 monitors the instantaneous rotary distance traveled by the rotary axis frame 16 along the $Z_R$ axis throughout the ball bond formation task to determine and signal completion of the task.

The next task of the bonding cycle is a loop formation task shown in steps 3D–3H, wherein the bond tool 11 lifts off of the first pad 110 to perform a complex series of XYZ motions in response to corresponding motions by the linear axis frame 14, rotary axis frame 16 and XY positioner, while maintaining the wire 24 attached to the first bond 118. The XYZ motions are depicted in FIG. 3 by the directional arrows and the $Z_{L-n}$ and $Z_{R-n}$ position indicators. The wire loop 120 resulting from the loop formation task enables the wire 24 to clear the substrate 112 when traveling to the second pad 111 as shown in step 3H. It is understood that the configuration of the wire loop 120 shown herein is exemplary and that the present invention is not limited to any specific configuration of the wire loop. Other wire loop configurations are possible within the scope of the present invention by modifying the path of the bond tool 11 in a manner apparent to the skilled artisan. It is noted that the rotary motion assembly retransitions from the second force applying mode back to the first positioning mode of operation at the onset of step 3D. The linear axis frame 14 ultimately returns to a point $Z_{L-2}$ upon completion of step 3G, but the bond tool 11 is vertically aligned with the second bonding site 121 on the second pad 111. The rotary axis frame 16 also returns to point $Z_{R-H}$, while the clamp is maintained open in steps 3C–3G.

Figures 3D, 3E, 3F, 3G, 3H:
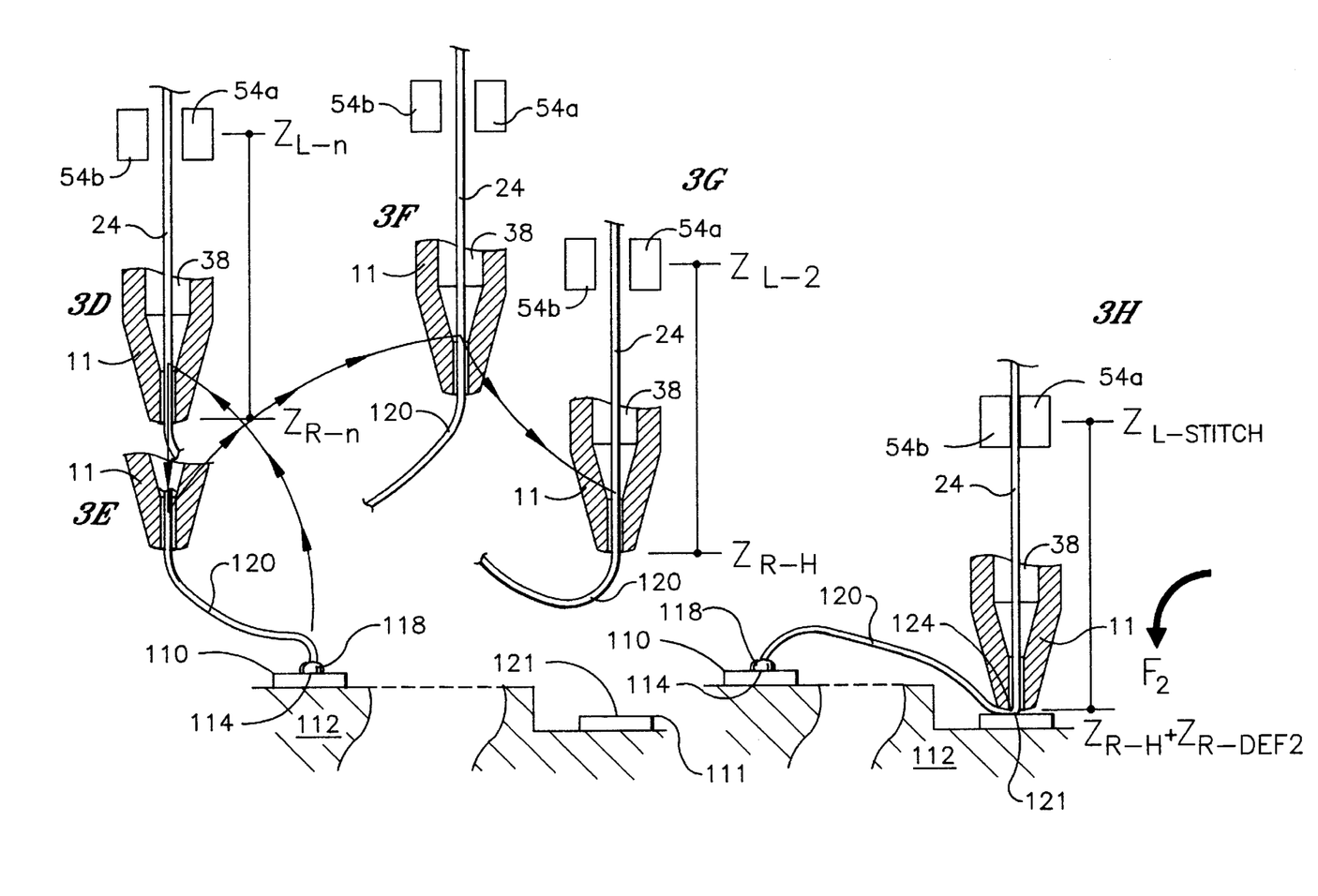

Upon completion of the loop formation task, Step 3H proceeds to another bond formation task, which includes lowering the linear axis frame 14 down along $Z_L$ to a point $Z_{L-STITCH}$ which brings the wire 24 into contact with the second bonding site 121, again as detected by the rotary servo system 92. Upon contact, the rotary motion assembly retransitions from the first positioning mode to the second force applying mode of operation, wherein the bond tool 11 applies a counterclockwise bonding force $F_2$ to the wire 24 along $Z_R$ at the second bonding site 121. The ultrasonic transducer 32 is reactivated in correspondence with application of the bonding force $F_2$. The resulting energy output from the ultrasonic transducer 32, in cooperation with the bonding force $F_2$ applied by the bond tool 11, deforms the wire 24 downward against the second pad 111. Deformation of the wire 24 causes the rotary axis frame 16 to rotate an additive distance $Z_{R-DEF2}$ counterclockwise past the point $Z_{R-H}$ along the $Z_R$ axis and creates the second wire bond 122, termed a stitch bond, at the second bonding site 121. The distance that the rotary axis frame 16 travels along the $Z_R$ axis during the stitch bond formation task in response to the bonding force $F_2$ is correlated to the degree of wire deformation, and correspondingly to the progress of the stitch bond formation task. Accordingly, the rotary position detector 90 monitors the instantaneous rotary distance traveled by the rotary axis frame 16 along the $Z_R$ axis throughout the stitch bond formation task to determine and signal completion of the task. It is noted that a crimp 124 is formed in the wire 24 at the stitch bond 122 as a result of the bonding force $F_2$ applied by the bond tool 11 to the wire 24. It is further noted that while the second bond 122 is being formed, the clamp 52 is simultaneously returned to the closed position which enables rapid transition to step 3I upon completion of the bond formation task.

Figures 3I, 3J:
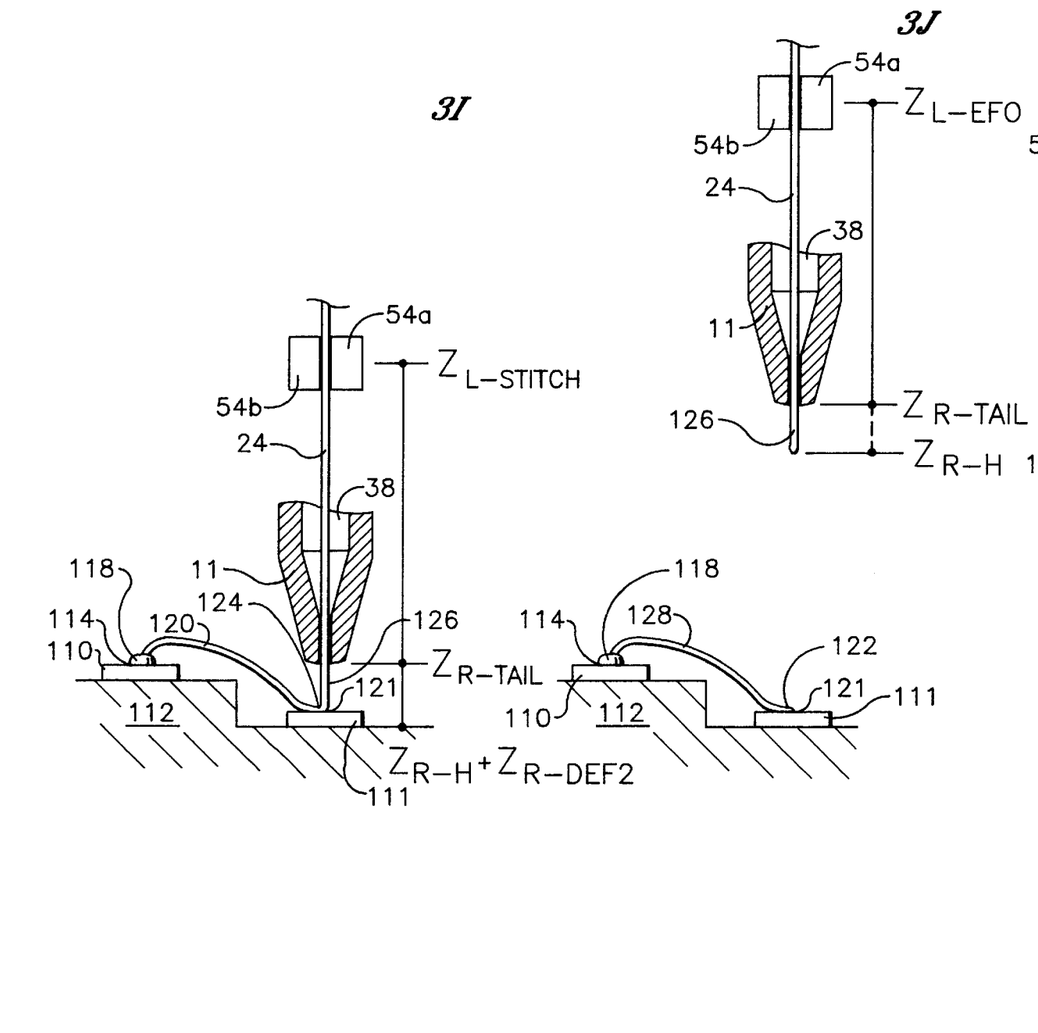
Figure 3K:
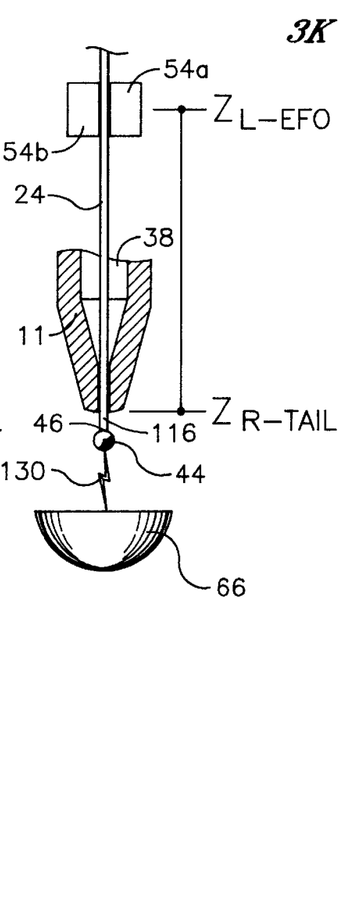

The final tasks of the bonding cycle are performed in steps 3I, 3J and 3K. Specifically, step 3I performs a tail formation task while step 3J simultaneously performs a wire break off task and another positioning task. In step 3I, the rotary axis frame 16 is rotated clockwise along $Z_R$ to point $Z_{R-TAIL}$ with the clamp 52 in the closed position so that a wire segment 126, termed a tail, which has a predetermined length significantly longer than that of the wire segment 116, is exposed between the second bond 122 and the bond tool 11. In step 3J, the linear axis frame 14 is raised along $Z_L$ with the clamp 52 in the closed position until the linear axis frame 14 reaches point $Z_{L-EFO}$. This upward movement along $Z_L$ causes the wire 24 to break off at the crimp 124 resulting in an electrically conductive wire segment 128 which electrically connects the first and second pads 110, 111. This completes the tail formation, wire break off and positioning tasks.

Step 3K performs a ball formation task after the bond tool 11 has been properly positioned in step 3J. In step 3K, the electronic flame off wand 66 is transitioned from the clearance position to the active position directly beneath the tail 126 as described above. The wand 66 is fired to create an arc plasma 130 which transforms the tail 126 into the ball 44. The wand 66 is then retransitioned to the clearance position, completing the bonding cycle and returning the bond head 10 to the condition of step 3A. Further bonding cycles are performed at additional bonding sites utilizing the XY positioner without interruption of bond head operation in accordance with the requirements of the host device being assembled.

The method of the present invention has been described above in the context of a simple bonding cycle applied to two bonding sites for purposes of illustration. It is apparent to the skilled artisan, however, that a more complex bonding cycle applying to a string of three or more pads can be provided within the scope of the present invention by modifying steps 3A–3K and supplementing them with additional steps. In particular, steps 3A–3K are modified by maintaining the integrity of the wire after the second bond is formed. Steps 3A–3K are then supplemented by repositioning and stitch bonding the wire to the bonding site on the third pad (not shown) of the series and repeating these tasks for each continuing pad, if any, of the series. The wire is broken off only after the bond is completed at the bonding site on the final pad of the series.

Figure 4:
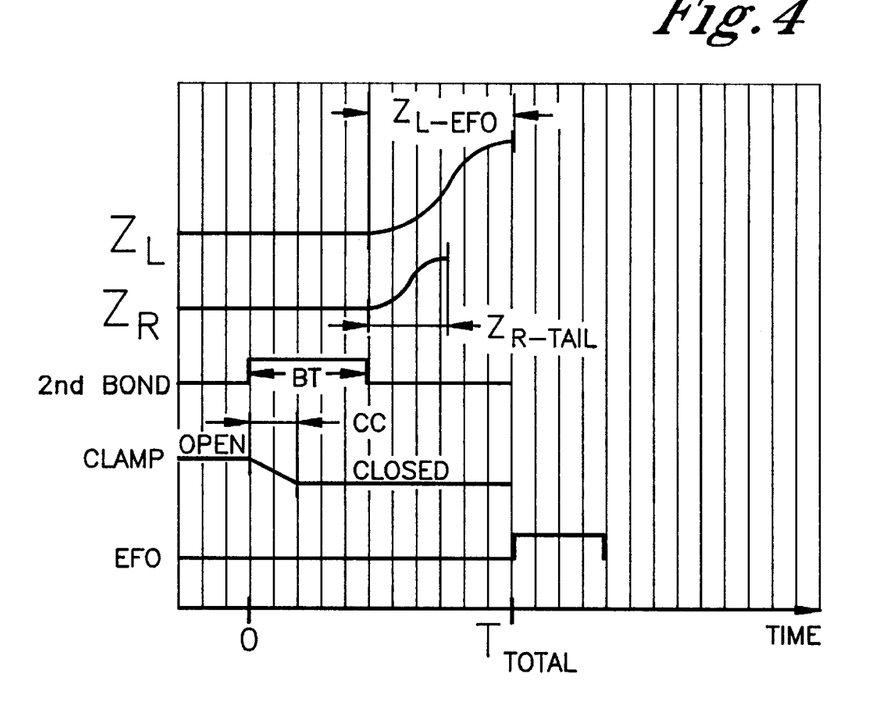
FIG. 4 is a graph showing the motive steps of the bond tool and wire clamp of FIG. 3 as a function of operating time.
Figure 5:
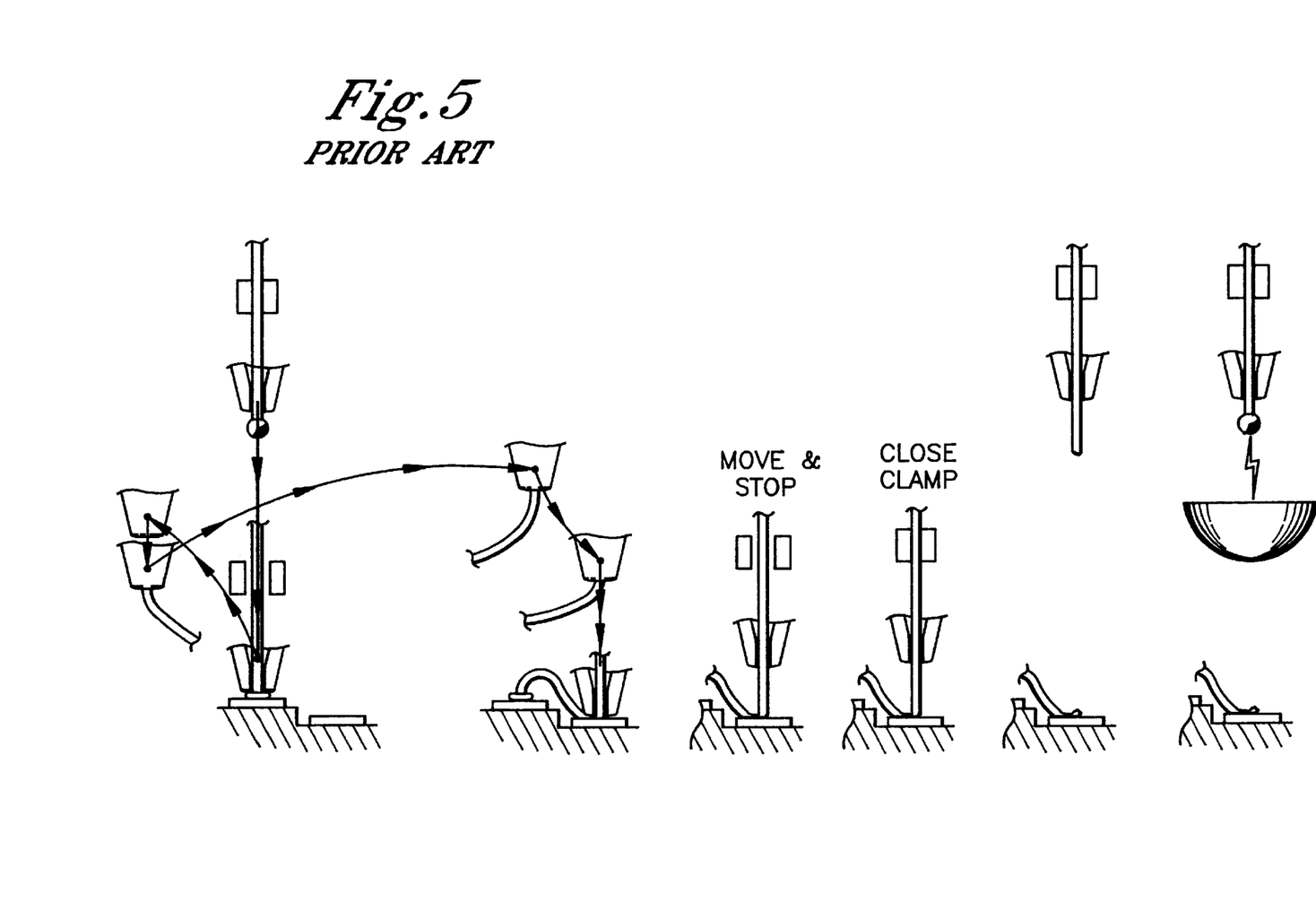
FIG. 5 is a diagrammatic view of a bond tool and cooperative wire clamp employed in a prior art bond head, which shows the motive steps of the bond tool and wire clamp during operation of the bond head.
Figure 6:
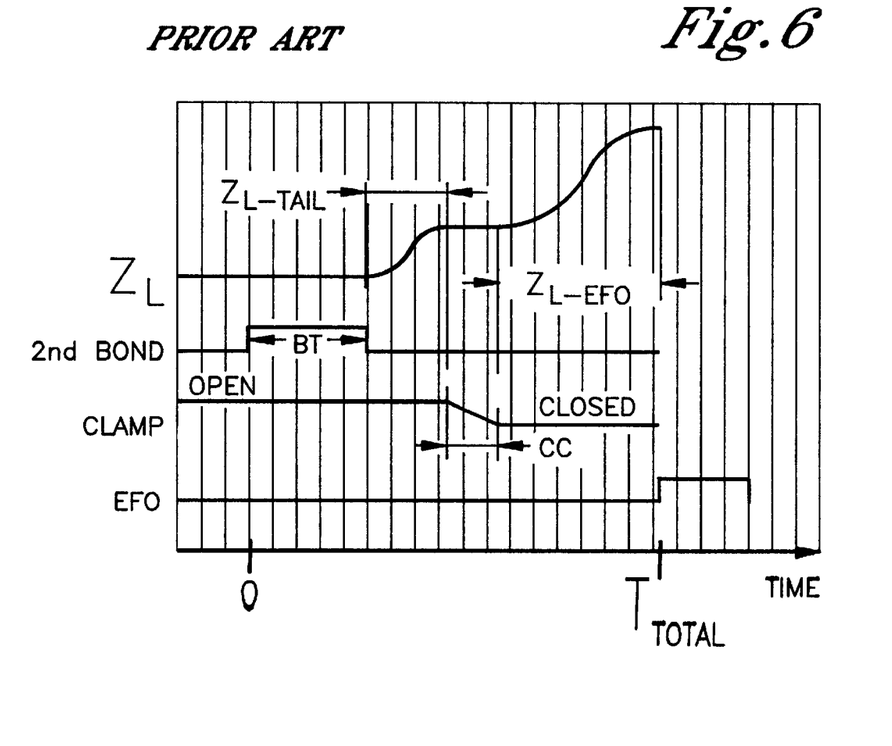
FIG. 6 is a graph showing the motive steps of the prior art bond tool and wire clamp of FIG. 5 as a function of operating time.

FIGS. 4–6 highlight the advantageous structural features of the present bond head 10 and their method of operation. FIG. 4 shows that substantial time efficiencies result by providing the bond head 10 with independent linear and rotary Z-axis positioning means and by directly and rigidly attaching the clamp 52 to the linear axis frame 14 of the bond head 10 in the manner of the present invention. The bond head 10 exhibits a significantly reduced overall operating time for the bonding cycle, which is attributable to specific operating time reductions achieved during the bond formation and tail formation tasks of steps 3H–3J. In particular, the present structure of the bond head 10 enables the bond head 10 to simultaneously perform clamp closure and ultrasonic bonding in the manner described above with reference to step 3H. The clamp closure time is typically significantly shorter than the ultrasonic bonding time BT. Accordingly, when the "CLAMP" curve of FIG. 4, representing clamp operation as a function of time, is juxtaposed with the "$2^{nd}$ BOND" curve, representing the second bonding task as function of time, it is evident that the bond head 10 effectively hides the clamp closure time CC within the ultrasonic bonding time BT to reduce overall operating time.

The present structure of the bond head 10 also enables the bond head 10 to simultaneously perform the tail formation and linear positioning tasks in the manner described above with reference to steps 3I and 3J. Rotary movement of the rotary axis frame 16 to point $Z_{R-TAIL}$ is typically significantly faster than linear movement of the linear axis frame 14 to point $Z_{L-EFO}$ because of the shorter travel distance and lighter load on the rotary axis frame 16. Accordingly, when the "$Z_L$" curve of FIG. 4, representing movement along the linear Z axis as a function of time, is juxtaposed with the "$Z_R$" curve, representing movement along the rotary Z axis as function of time, it is evident that the bond head 10 effectively hides the rotary travel time $Z_{R-TAIL}$ within the linear travel time $Z_{L-EFO}$ to reduce overall operating time. In FIG. 4, the horizontal axis, representing time, shows the specific time efficiencies achieved by steps 3H–3J with step 3H being initiated at time=0 and 3J being completed at time=$T_{TOTAL}$.

FIG. 5 shows the sequence of tasks performed by a conventional prior art bond head, such as disclosed in U.S. Pat. No. 4,610,387. FIG. 6 correlates the tasks to the operating time of the prior art bond head. FIGS. 5 and 6 are presented in substantially the same format as FIGS. 3 and 4 for purposes of comparison. FIG. 6 shows that the prior art bond head does not realize the time efficiencies of the present bond head 10 because the prior art bond head must perform virtually all individual tasks separately and sequentially by virtue of its structural limitations. In particular, the prior art clamp is structurally independent of the frames controlling bond tool motion. Thus, the prior art bond head is unable to simultaneously perform clamp closure and ultrasonic bonding in the manner shown in step 3H of FIG. 3. Nor is the prior art bond head able to simultaneously perform the tail formation, wire break off and positioning tasks in the manner shown in steps 3I and 3J of FIG. 3 because these tasks are performed by the prior art bond head using only motion of the bond tool along the linear axis.

While the forgoing preferred embodiments of the invention have been described and shown, it is understood that alternatives and modifications, such as those suggested and others, may be made thereto and fall within the scope of the invention.

We claim:

1. A bond head for a wire bonding machine comprising:

a stationary frame;

a linear axis frame vertically linearly displacable relative to said stationary frame along a linear axis;

a rotary axis frame;

a pivotal connector pivotally connecting said linear axis frame to said rotary axis frame, said pivotal connector enabling rotational displacement of said rotary axis frame relative to said stationary frame along a rotary axis independent of vertical linear displacement of said linear axis frame along said linear axis, while maintaining said linear axis frame in a rotationally stationary position at all times relative to said stationary frame;

a bond tool connected to said rotary axis frame, said bond tool vertically linearly displacable in response to vertical linear displacement of said linear axis frame and rotationally displacable in response to rotational displacement of said rotary axis frame;

a wire clamp connected to said linear axis frame and vertically linearly displacable in response to vertical linear displacement of said linear axis frame, wherein said clamp has an open position permitting travel of a wire past said clamp and a closed position preventing travel of a wire past said clamp;

a linear motion assembly including a linear driver driving vertical linear displacement of said linear axis frame; and a rotary motion assembly including a rotary driver driving rotational displacement of said rotary axis frame.

2. The bond head of claim 1 wherein said rotary driver includes a rotary driver voice coil engaging said rotary axis frame and a rotary driver magnet engaging said linear axis frame, or wherein said rotary driver voice coil engages said linear axis frame and said rotary driver magnet engages said rotary axis frame.

3. The bond head of claim 1 wherein said rotary motion assembly includes a rotary driver controller.

4. The bond head of claim 3 wherein said rotary driver controller is a rotary servo system.

5. The bond head of claim 4 wherein said rotary servo system is in communication with said rotary driver and a rotary position detector included in said rotary motion assembly.

6. The bond head of claim 1 wherein said rotary motion assembly includes a rotary position detector.

7. The bond head of claim 1 wherein said linear driver includes a linear driver voice coil engaging said linear axis frame and a linear driver magnet engaging said stationary frame, or wherein said linear driver voice coil engages said stationary frame and said linear driver magnet engages said linear axis frame.

8. The bond head of claim 1 wherein said linear motion assembly includes a linear driver controller.

9. The bond head of claim 8 wherein said linear driver controller is a linear servo system.

10. The bond head of claim 9 wherein said linear servo system is in communication with said linear driver and a linear position detector included in said linear motion assembly.

11. The bond head of claim 1 wherein said linear motion assembly includes a linear position detector.

12. A wire bonding method comprising:
 providing a bond tool having a first side and a second side opposite said first side and having a linear axis of motion and a rotary axis of motion;
 providing a wire slidably engaging said bond tool, said wire having a first point on said first side of said bond tool and having a second point on said second side of said bond tool;
 providing a clamp on said second side of said bond tool in fixed relation to said bond tool with respect to said linear axis of motion, said clamp being selectively transitionable between a closed position wherein said clamp prevents travel of said wire past said clamp and an open position wherein said clamp permits travel of said wire past said clamp;
 positioning said bond tool at a first bonding site while said clamp is in said open position, wherein said first point on said wire is proximal to said first bonding site and said second point on said wire is distal to said first bonding site;
 applying a first bonding force along said rotary axis of motion to said first point with said bond tool to bond said first point to said first bonding site and form a first bond;
 positioning said bond tool at a second bonding site with said second point proximal to said second bonding site and said first point distal to said second bonding site; and
 applying a second bonding force along said rotary axis of motion to said second point with said bond tool to bond said second point to said second bonding site and form a second bond, while simultaneously transitioning said clamp from said open position to said closed position.

13. The wire bonding method of claim 12 wherein said bond tool is positioned at said first bonding site by vertically linearly displacing said bond tool to the vertical level of said first bonding site while rotationally displacing said bond tool to perpendicularly align said bond tool with said first bonding site.

14. The wire bonding method of claim 12 wherein said bond tool is positioned at said second bonding site by vertically linearly displacing said bond tool to the vertical level of said second bonding site while rotationally displacing said bond tool to perpendicularly align said bond tool with said second bonding site.

15. The wire bonding method of claim 12 further comprising forming a loop in said wire between said first and said second bonding sites by vertically linearly displacing said bond tool and rotationally displacing said bond tool.

16. The wire bonding method of claim 12 further comprising monitoring the progress of forming said first bond by measuring the rotational displacement of said bond tool while said first bonding force is applied by said bond tool.

17. The wire bonding method of claim 12 further comprising monitoring the progress of forming said second bond by measuring the rotational displacement of said bond tool while said second bonding force is applied by said bond tool.

18. The wire bonding method of claim 12 wherein said first bond is a ball bond and said second bond is a stitch bond.

19. A wire bonding method comprising:
 providing a bond tool having a first side and a second side opposite said first side and having a linear axis of motion and a rotary axis of motion;
 providing a wire slidably engaging said bond tool, said wire having a first point on said first side of said bond tool and having a second point on said second side of said bond tool;
 providing a clamp on said second side of said bond tool in fixed relation to said bond tool with respect to said linear axis of motion, said clamp being selectively transitionable between a closed position wherein said clamp prevents travel of said wire past said clamp and an open position wherein said clamp permits travel of said wire past said clamp;
 positioning said bond tool at a first bonding site, wherein said first point on said wire is proximal to said first bonding site and said second point on said wire is distal to said first bonding site;
 applying a first bonding force along said rotary axis of motion to said first point with said bond tool to bond said first point to said first bonding site and form a first bond;
 positioning said bond tool at a second bonding site with said second point proximal to said second bonding site and said first point distal to said second bonding site;
 applying a second bonding force along said rotary axis of motion to said second point with said bond tool to bond said second point to said second bonding site and form a second bond; and
 breaking said wire proximal to said second bonding site by raising said bond tool away from said second bonding site with respect to said linear axis of motion while simultaneously rotating said bond tool away from said second bonding site with respect to said rotary axis of motion to form a wire segment extending from said first bonding site to said second bonding site.

20. The wire bonding method of claim 19 wherein said bond tool is positioned at said first bonding site by vertically linearly displacing said bond tool to the vertical level of said first bonding site while rotationally displacing said bond tool to perpendicularly align said bond tool with said first bonding site.

21. The wire bonding method of claim 19 wherein said bond tool is positioned at said second bonding site by vertically linearly displacing said bond tool to the vertical level of said second bonding site while rotationally displacing said bond tool to perpendicularly align said bond tool with said second bonding site.

22. The wire bonding method of claim 19 further comprising forming a loop in said wire between said first and said second bonding sites by vertically linearly displacing said bond tool and rotationally displacing said bond tool.

23. The wire bonding method of claim 19 further comprising monitoring the progress of forming said first bond by measuring the rotational displacement of said bond tool while said first bonding force is applied by said bond tool.

24. The wire bonding method of claim 19 further comprising monitoring the progress of forming said second bond by measuring the rotational displacement of said bond tool while said second bonding force is applied by said bond tool.

25. The wire bonding method of claim 19 wherein said first bond is a ball bond and said second bond is a stitch bond.

26. A bond head for a wire bonding machine comprising:

a stationary frame having a stationary vertical face;

a linear axis frame having a displacable vertical face opposing said stationary vertical face;

a linear slidable connection between said stationary vertical face and said displacable vertical face to enable vertical linear displacement of said displacable vertical face relative to said stationary vertical face and to enable vertical linear displacement of said linear axis frame relative to said stationary frame; and a rotary axis frame;

a pivotal connector pivotally connecting said rotary axis frame to said linear axis frame, said pivotal connector enabling rotational displacement of said rotary axis frame relative to said stationary frame simultaneous with vertical linear displacement of said linear axis frame, while maintaining said linear axis frame in a rotationally stationary position at all times relative to said stationary frame; and a bond tool connected to said rotary axis frame, said bond tool vertically linearly displacable in response to vertical linear displacement of said linear axis frame and rotationally displacable in response to rotational displacement of said rotary axis frame.

27. The bond head of claim 26 wherein said linear slidable connection is a linear bearing.

28. The bond head of claim 26 further comprising a linear driver including a linear driver voice coil engaging said linear axis frame and a linear driver magnet engaging said stationary frame, or wherein said linear driver voice coil engages said stationary frame and said linear driver magnet engages said linear axis frame.

29. The bond head of claim 26 further comprising a rotary driver including a rotary driver voice coil engaging said rotary axis frame and a rotary driver magnet engaging said linear axis frame, or wherein said rotary driver voice coil engages said linear axis frame and said rotary driver magnet engages said rotary axis frame.

* * * * *